United States Patent
Liu et al.

(10) Patent No.: US 7,791,517 B2
(45) Date of Patent: Sep. 7, 2010

(54) FULLY DIFFERENTIAL DELTA SIGMA MODULATOR

(75) Inventors: Shen-Iuan Liu, Taipei (TW); Mu-Chen Huang, Kaohsiung (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 12/346,083

(22) Filed: Dec. 30, 2008

(65) Prior Publication Data

US 2010/0045498 A1    Feb. 25, 2010

(30) Foreign Application Priority Data

Aug. 19, 2008    (TW) .............................. 97131654 A

(51) Int. Cl.
*H03M 3/00* (2006.01)

(52) U.S. Cl. ...................................... 341/143; 341/144

(58) Field of Classification Search ................. 341/143, 341/144, 155, 120
See application file for complete search history.

(56) References Cited

U.S. PATENT DOCUMENTS

| | | | | |
|---|---|---|---|---|
| 4,573,020 | A * | 2/1986 | Whatley | 330/258 |
| 6,697,001 | B1 * | 2/2004 | Oliaei et al. | 341/143 |
| 7,009,541 | B1 * | 3/2006 | Nguyen | 341/143 |
| 7,564,307 | B2 * | 7/2009 | Hunter et al. | 330/258 |

* cited by examiner

*Primary Examiner*—Brian Young
(74) *Attorney, Agent, or Firm*—Volpe and Koenig P.C.

(57) ABSTRACT

A fully differential delta sigma modulator is provided. The fully differential delta sigma modulator has an integrator in which a comparator replaces an operational amplifier for decreasing power consumption. The integrator extends to a fully differential implementation with the addition of a common-mode feedback circuit for improving equivalent input and signal-to-noise ratio.

4 Claims, 5 Drawing Sheets

FULLY DIFFERENTIAL DELTA SIGMA MODULATOR

FIELD OF THE INVENTION

The present invention generally relates to a delta-sigma modulator, and in particular to a delta-sigma modulator having a fully differential feature therein.

BACKGROUND OF THE INVENTION

After a delta-sigma modulator emerges, recently it is prevailing due to the rapid progress of semi-conductor technology. The most of IC manufacturers produce these products and apply them in the communication, multimedia, signal processing and so on for converting signals to digital or analog.

A prior second-order delta-sigma modulator can process a signal via two integrators (operational amplifiers) and a quantizer (comparator), and feed the signal back to an input terminal of the integrator. FIG. 1 illustrates a prior delta-sigma modulator. As shown in FIG. 1, a delta-sigma modulator 1 transmits an signal operated by a first adder orderly to a first integrator 110, a second adder 101, a second integrator 111 and a quantizer 112, and converts the signal to a digital signal via quantizer 112. Finally, the digital signal is processed by a digital-to-analog converter and then fed back to the first adder and the second adder in order to operate the signal with addition or subtraction in the adders.

The circuit of the delta-sigma modulator 1 can estimate a signal roughly, measure a delta and compensate the delta with integration. If the integration of the delta is finite, the average value of the final output signal equals average value of the input signal. The same principle also applies to multi-order delta-sigma modulator, and the output is $\log_2 N$ bits when the order is N. Besides, the higher the order, the better the noise shaping. Usually, the second-order delta-sigma modulator circuit is the one-bit status and it is to say that the output is only "1" or "0." Hence, all the range of voltage is linear, and that's why the delta-sigma modulator can perform a high accuracy.

With the development of nanotechnology, the demand for the electronic components with tiny size and energy saving becomes more and more increasing, and the modulator is no exception. However, the original modulator comprising integrators composed of operational amplifiers can not meet the demand nowadays. Therefore, it brooks no delay to invent a modulator with less power consumption and higher efficiency. In order to overcome the drawbacks of the prior modulator, the inventors research and experiment without giving up, and finally invent "Fully Differential Delta Sigma Modulator" to overcome the drawbacks. The summary of the present invention is described as follows.

SUMMARY OF THE INVENTION

The object of the present invention is to provide a delta-sigma modulator, wherein the integrator having a comparator replacing an operational amplifier is different from a prior one in order to largely reduce the power consumption caused by using the operational amplifier. Besides, for achieving the fully differential operation the integrator further comprises a common-mode feedback circuit increasing the range of equivalent input and the signal-to-noise ratio (SNR).

According to one aspect of the present invention, a delta-sigma modulator is provided. The delta-sigma modulator comprises: a first integrator comprising a first comparator and a first common-mode feedback circuit coupled to the first comparator, and receiving a first input signal to generate a second input signal; and a second integrator coupled to the first integrator, comprising a second comparator and a second common-mode feedback circuit coupled to the second comparator, and receiving the second input signal to generate a third input signal.

Preferably, the delta-sigma modulator further comprises: a quantizer coupled to the second integrator and receiving the third input signal to generate an output signal; and a digital-to-analog converter converting the output signal to a first analog signal and feeding the first analog signal back to the first and the second integrators.

Preferably, the delta-sigma modulator is provided, wherein the first input signal is a second analog signal.

Preferably, the delta-sigma modulator further comprises an amplifier stabilizing the second input signal at a value of a first common-mode voltage and the third input signal at a value of a second common-mode voltage.

Preferably, the delta-sigma modulator is provided, wherein the quantizer further comprises a comparator.

Preferably, the delta-sigma modulator is provided, wherein the output signal is a digital signal.

Preferably, the delta-sigma modulator further comprises a first adder coupled to the first integrator and the digital-to-analog converter, and operating the first input signal and the first analog signal.

Preferably, the delta-sigma modulator further comprises a second adder coupled to the first integrator, the second integrator and the digital-to-analog converter, and operating the second input signal and the first analog signal.

Preferably, the delta-sigma modulator is provided, wherein the first analog signal has a stable linearity.

Preferably, the delta-sigma modulator performs a fully differential operation.

Preferably, the delta-sigma modulator further comprises a plurality of current resources.

According to one aspect of the present invention, a delta-sigma modulator is provided. The delta-sigma modulator comprises: an integrator comprising a comparator, a common-mode feedback circuit, at least one charging current source and at least one discharging current resource, and generating a signal to balance the at least one charging current source with the at least one discharging current resource.

Preferably, the delta-sigma modulator further comprises a quantizer coupled to an output terminal of the integrator and converting an output signal to a digital output signal.

Preferably, the delta-sigma modulator is provided, wherein the common-mode feedback circuit is a negative feedback circuit comprising an amplifier having a non-inverting input terminal and a pair of capacitors coupled to the non-inverting input terminal and stabilizing the output signal at a value of a common-mode voltage.

Preferably, the delta-sigma modulator is provided, wherein the quantizer further comprises a comparator.

Preferably, the delta-sigma modulator further comprises a digital-to-analog converter converting the digital output signal to an analog signal and feeding the analog signal back to the integrator.

Preferably, the delta-sigma modulator further comprises an adder coupled to the integrator and the digital-to-analog converter, and operating the analog signal.

According to one aspect of the present invention, an operational circuit is provided. The operational circuit comprises: an integrator comprising a comparator and a common-mode feedback circuit.

Preferably, the operational circuit further comprises a plurality of current resources and generates a signal to balance the plurality of current sources.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

Figure 1:
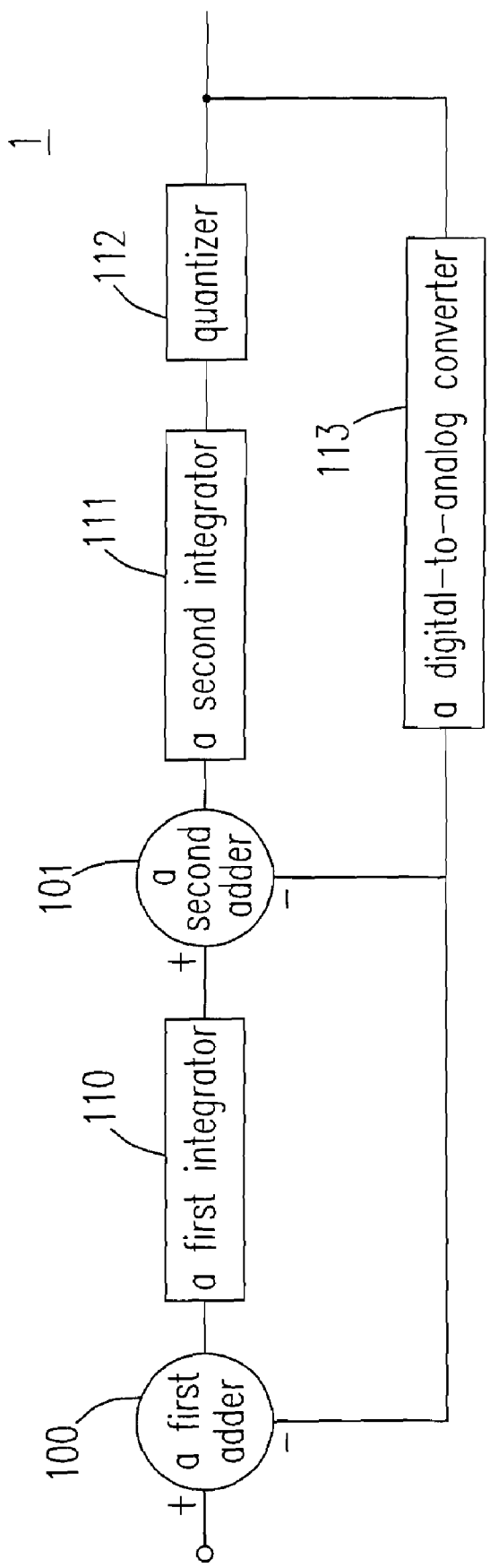
FIG. 1 shows a prior delta-sigma modulator.
Figure 2:
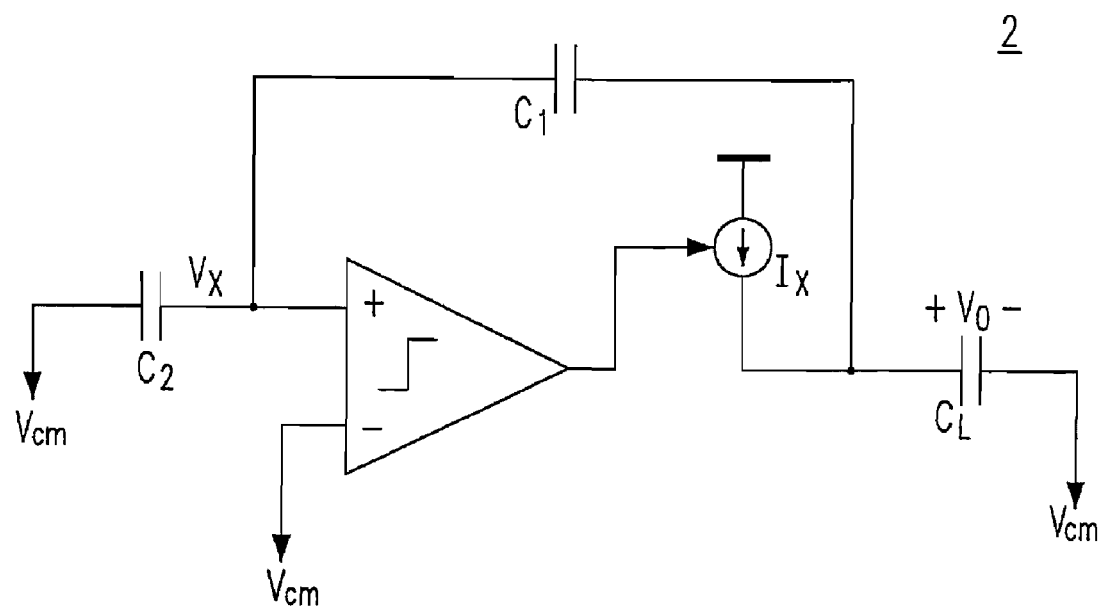
FIG. 2 shows a single-ended integrator circuit according to the present invention.

Please refer to FIG. 2, which shows a single-ended integrator circuit of the present invention, and the single-end structure illustrates the technical scheme of the integrator by a simple way. The single-ended integrator 2 replaces a prior operational amplifier with a comparator and a current source $I_X$. When the current source $I_X$ is turned on, the capacitor network consisting of a capacitor $C_1$, a capacitor $C_2$ and a capacitor $C_L$ is charged up and increases an output node voltage $V_O$ and a node voltage $V_X$. The voltages increase continuously until the virtual ground condition (the node voltage $V_X$=a common-mode voltage $V_{CM}$) is detected by the comparator and the current source $I_X$ is turned off. In this process, the sampling instant is determined by the comparator, and at the sampling instant has the same virtual ground condition been obtained as in a single-ended integrator having an operational amplifier. Besides, more than one current source can be added if needed.

Based on the above technical scheme of FIG. 2, the original single-ended structure is changed into the fully differential structure. Please refer to FIG. 3, which shows a fully differential integrator 3 having a comparator. In the fully differential integrator 3, if the charges are transferred only by two large current sources $I_1$ and $I_3$, an large overshoot error will occur, thus the small current sources $I_2$ and $I_4$ are engaged to compensate for the error and ensure that output settles to the steady-state value with an acceptable overshoot voltage.

However, a proper fully differential operation suggests the ideal matching between I1 and I3 so as I2 and I4. Due to PVT (process, voltage, and temperature) variations, these current deviate form their ideal magnitudes inevitably. In order to address the issue, the fully differential integrator 3 needs to comprise a common-mode feedback circuit to regulate the discharging current source $I_2$ and the discharging current source $I_3$ for maintaining the ideal fully differential operation.

Figure 3:
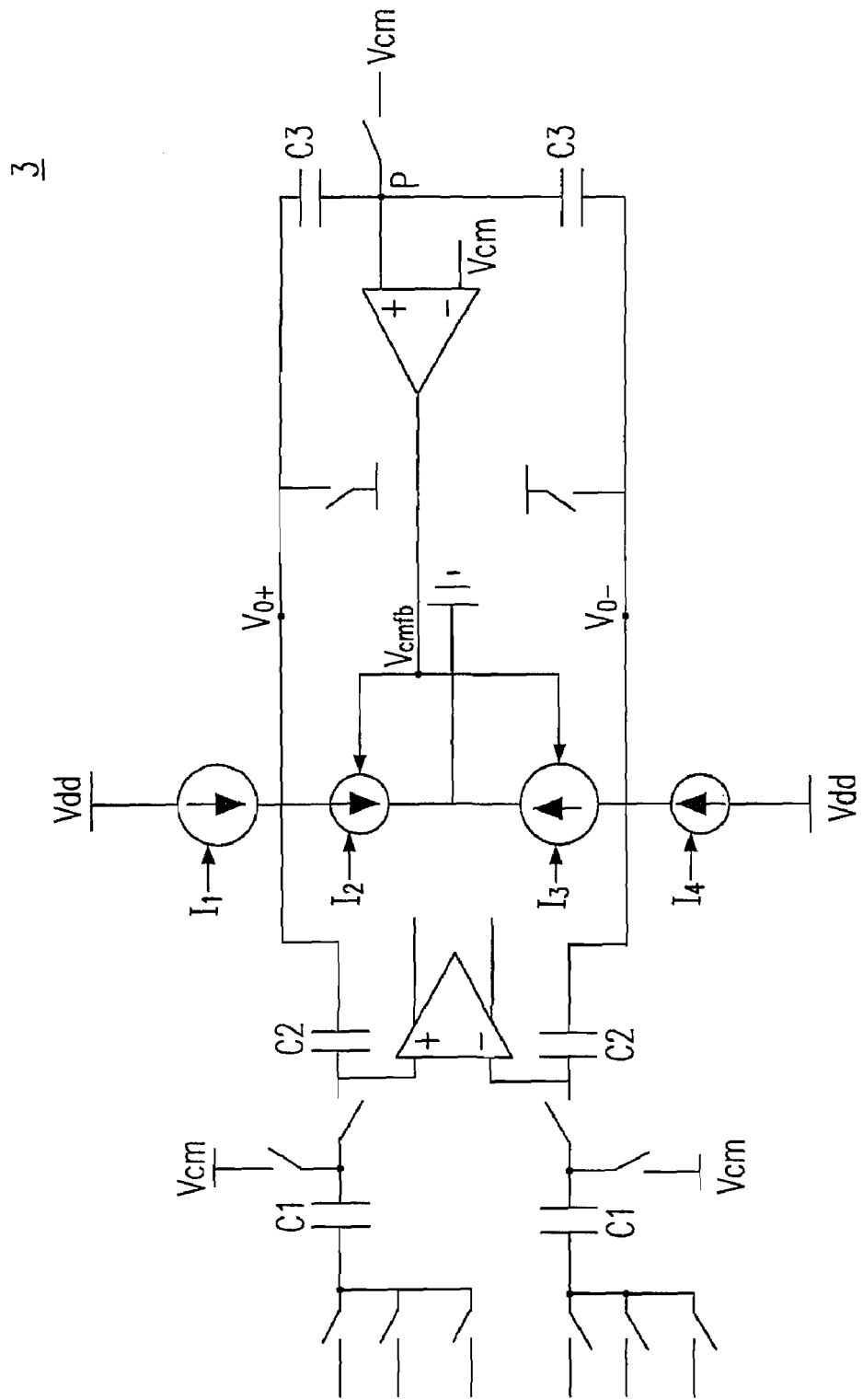
FIG. 3 shows a fully differential integrator circuit comprising a comparator according to the present invention.

The common-mode feedback circuit shown in FIG. 3 comprises two identical capacitors $C_3$ coupled to each other, wherein each capacitors is respectively coupled to the two output terminals to make the voltage at the node P between the capacitors an average value of the output voltages $V_{O+}$ and $V_{O-}$, and the average value should be the common-mode voltage $V_{CM}$ in the normal differential operation. The charging current sources are fixed in magnitudes while the discharging ones are controlled by the common-mode feedback circuit. If the current sources do not match, the voltage at node P will deviate from the common-mode voltage $V_{CM}$. In the meantime, a simple amplifier is used to control the current sources, wherein a non-inverting input terminal of the amplifier is coupled to the node P between the capacitors to form a negative feedback mechanism so that the voltage will recover to common-mode voltage $V_{CM}$, and it is to say that the large current sources $I_1$ and $I_3$ will be regulated to a same value, and so will the small current sources $I_2$ and $I_4$. This is because the operation of the circuit is to turn on the large current sources $I_1$ and $I_3$ to charge and discharge the capacitors, and then to turn off the large current sources $I_1$ and $I_3$ and to turn on the small current sources $I_2$ and $I_4$ to further fine-tune the voltage at a ideal voltage. Therefore, the ideal situation is that the large current sources $I_1$ and $I_3$ are the same and so are the small current sources $I_2$ and $I_4$.

Figure 5:
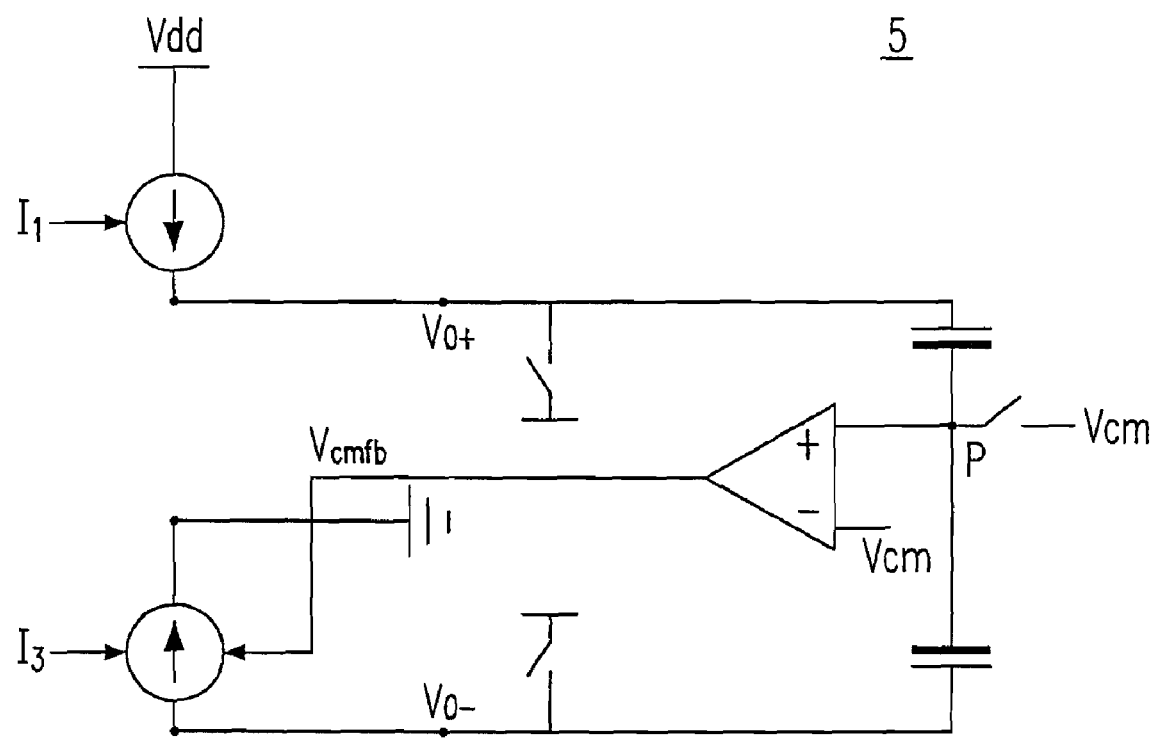
FIG. 5 shows a mechanism of the negative feedback for fully differential integrator according to the present invention.

The details of the above negative feedback mechanism are shown in FIG. 5. If the charging current source $I_1$ is larger than the discharging current source $I_3$ during the charge transfer stage, the input voltage at the non-inverting input terminal of the amplifier, i.e. the average of the output voltages $V_{O+}$ and $V_{O-}$, will be larger than the common-mode voltage $V_{CM}$, wherein the common-mode feedback voltage $V_{CMFB}$ output by the amplifier will also rise to increase the discharging current source $I_3$ and to reduce the difference between the charging current source $I_1$ and the discharging current source $I_3$ for regulating the average of the output voltages $V_{O+}$ and $V_{O-}$ to the common-mode voltage $V_{CM}$. In order to avoid the malfunction caused by the leakage at the node P between the two identical capacitors, the voltage of node P is refreshed to the common-mode voltage $V_{CM}$ while the output terminals (the nodes of $V_{O+}$ and $V_{O-}$) are precharged.

According to the above technical scheme, it can be derived that the common-mode feedback circuit still can regulate the average of the output voltages $V_{O+}$ and $V_{O-}$ to the common-mode voltage $V_{CM}$ when the charging current source is smaller than the discharging current source.

The delta-sigma modulator in the present invention adopts the self-invented fully differential integrator 3 comprising the comparator and the common-mode feedback. Besides, when needed the number of the integrator can be added without departing from the spirit of the circuit and the scope of the invention.

Figure 4:
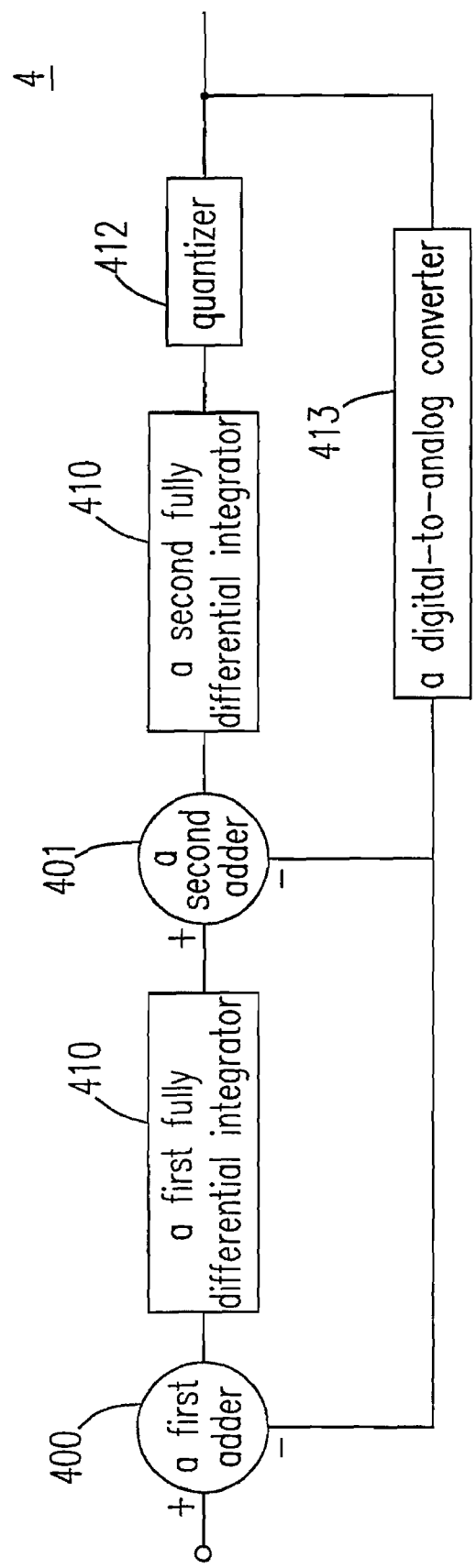
FIG. 4 shows a second-order delta-sigma modulator according to the present invention.

Please refer to FIG. 4, which shows a second-order delta-sigma modulator. A signal is operated by a first adder 400 and transmitted to a first fully differential integrator 410. Then, the signal is transmitted through a second adder 401, a second fully differential integrator 411 and a quantizer 412, wherein the quantizer 412 converts the analog signal into a digital signal. Finally, the digital signal is processed by a digital-to-analog converter 413 and then fed back to the first adder 400 and the second adder 401, wherein the signal can be operated by these adders.

In virtue of using the fully differential integrator in the present invention, it reduces the power consumption, improves equivalent range of the input of the integrator and signal-to-noise ratio, and maintains the common-mode voltage and linearity. Besides, the fully differential integrator in the present invention can apply to any operational circuit.

Whereas alternations and modifications of the present invention will no doubt be apparent to a person of ordinary skilled in the art, it is to be understood that the embodiments shown and described by way of illustration are by no means intended to be considered limitation. Accordingly, it is to be intended by the claims to cover all alternations of the invention which fall in the spirit and scope of the invention.

What is claimed is:

1. A delta-sigma modulator comprising:
   an integrator comprising a comparator, a common-mode feedback circuit, at least one charging current source and at least one discharging current resource, and generating a signal to balance the at least one charging current source with the at least one discharging current resource; and
   a quantizer coupled to an output terminal of the integrator and converting an output signal to a digital output signal;
   wherein the common-mode feedback circuit is a negative feedback circuit comprising an amplifier having a non-inverting input terminal and a pair of capacitors coupled to the non-inverting input terminal and stabilizing the output signal at a value of a common-mode voltage.

2. A delta-sigma modulator as claimed in claim 1 wherein the quantizer further comprises a comparator.

3. A delta-sigma modulator as claimed in claim 1 further comprising a digital-to-analog converter converting the digital output signal to an analog signal and feeding the analog signal back to the integrator.

4. A delta-sigma modulator as claimed in claim 3 further comprising an adder coupled to the integrator and the digital-to-analog converter, and operating the analog signal.

* * * * *